United States Patent [19]

Minetti

[11] 4,332,341
[45] Jun. 1, 1982

[54] FABRICATION OF CIRCUIT PACKAGES USING SOLID PHASE SOLDER BONDING

[75] Inventor: Richard H. Minetti, Allentown, Pa.

[73] Assignee: Bell Telephone Laboratories, Incorporated, Murray Hill, N.J.

[21] Appl. No.: 107,326

[22] Filed: Dec. 26, 1979

[51] Int. Cl.³ .............................................. H01L 21/603
[52] U.S. Cl. ................................. 228/180 A; 228/188; 228/193
[58] Field of Search ................... 228/123, 124, 180 A, 228/188, 193; 357/68

[56] References Cited

U.S. PATENT DOCUMENTS

| | | | |
|---|---|---|---|
| 3,292,240 | 12/1966 | McNutt et al. | 228/180 A X |
| 3,373,481 | 3/1968 | Lins et al. | 228/180 A X |
| 3,504,096 | 3/1970 | Nagel | 357/81 X |
| 3,555,664 | 1/1971 | Bingham et al. | 228/180 A X |
| 3,561,107 | 2/1971 | Best et al. | 228/180 A X |
| 3,591,839 | 7/1971 | Evans | 228/180 A X |
| 4,143,385 | 3/1979 | Miyashi | 357/68 X |

OTHER PUBLICATIONS

Manko *Solders and Soldering* McGraw Hill, 1964, pp. 124–125.

*Primary Examiner*—Kenneth J. Ramsey
*Attorney, Agent, or Firm*—Lester H. Birnbaum

[57] ABSTRACT

A method of forming circuit packages including bonding an electronic component, (10) such as a chip carrier, to a supporting substrate (22). Solid solder preforms (13) are applied to contact members (12) on the component or substrate or both. The preforms are bonded to the contact members by heating to a temperature below the melting point of the solder while applying force to the preforms. The preforms are therefore bonded without melting, and fluxing and cleaning operations may be eliminated. The component can then be bonded to the substrate by the same solid phase technique.

13 Claims, 5 Drawing Figures

FABRICATION OF CIRCUIT PACKAGES USING SOLID PHASE SOLDER BONDING

BACKGROUND OF THE INVENTION

This invention relates to the fabrication of circuit packages, and in particular to a method of bonding solder preforms to electronic components and/or to supporting substrates.

The packaging of silicon integrated circuits by the use of hermetically sealed chip carriers is the subject of increasing interest in the industry. Typically, the circuit chip is bonded to one surface of the chip carrier, which is in turn bonded to a supporting substrate which can be a printed wiring board or a ceramic including a thick film or thin film circuit. A convenient method of bonding is by soldering together corresponding contact members on the carrier and substrate. Solder can be applied by dipping or printing. However, reliable connections usually require a precise solder volume per connection which is not easily obtainable by such methods. In addition, a large gap distance between the carrier and substrate is usually required to permit cleaning and encapsulation of the area of the substrate under the chip.

It has therefore been proposed to bond the carrier to the substrate, which include first and second sets of contact pads respectively, by bonding massive solder spheres to one set of pads, bringing the other set of contact pads into contact with the spheres and then bonding the pads together while maintaining a gap distance of at least 10 mils (see, U.S. Patent application of P. M. Hall et al., Ser. No. 107,327, filed on an even date herewith and assigned to the same assignee, which application is incorporated by reference herein). In accordance with one embodiment of that method, the spheres are first bonded to the carrier by fluxing the carrier, applying the spheres, reflowing the solder to form the bond, and then removing the flux. The procedure of fluxing, reflowing and cleaning is then repeated when the bumped carrier is bonded to the supporting substrate.

While the process described above is adequate for most purposes, it does result in a relatively low output and therefore would not appear to be optimum for high volume production. In addition, application and removal of flux provide additional cost to fabrication of a package. A further problem with a reflow process is that solder will flow into the castellations (grooves) of the carrier and therefore make probe testing of the carrier difficult.

It will also be appreciated that there are many other types of packaging which require a precise amount of solder for bonding, for example, bonding ceramic chip capacitors and silicon integrated circuit chips to hybrid integrated circuit substrates. In the latter case, for example, it may be desirable to apply solder preforms to a leadless chip, a beam lead contact, or the metal tape carrier used in the chip-and-tape technology. There are also packages which utilize thin film circuits bonded to a ceramic thin film circuit "mother" board.

It is therefore an object of the invention in the fabrication of circuit packages to provide a method of bonding an electronic component to a supporting substrate which permits high volume production while placing a precise solder volume at each bonding site.

SUMMARY OF THE INVENTION

This and other objects are achieved in accordance with the invention. In one aspect, the invention involves bonding solid solder preforms to contact members of an electronic component. The preforms are heated to a temperature below the melting point of the solder and are brought into contact with the contact members with sufficient mechanical force applied to the preforms to produce a bond while the solder is kept in a solid phase. In accordance with another aspect of the invention, the method involves bonding one electronic component with a first set of contact members to another component with a second set of contact members corresponding to the first set. Solid solder preforms are bonded to one of the sets of contact members by supplying heat and force while keeping the preforms in a solid phase. The other set of contact members are then brought into contact with the preforms so as to solder the members together. The latter step can also be accomplished by supplying heat and force while keeping the solder in solid phase.

BRIEF DESCRIPTION OF THE DRAWING

These and other features of the invention are delineated in detail in the following description. In the drawing.

DETAILED DESCRIPTION

Figure 1:
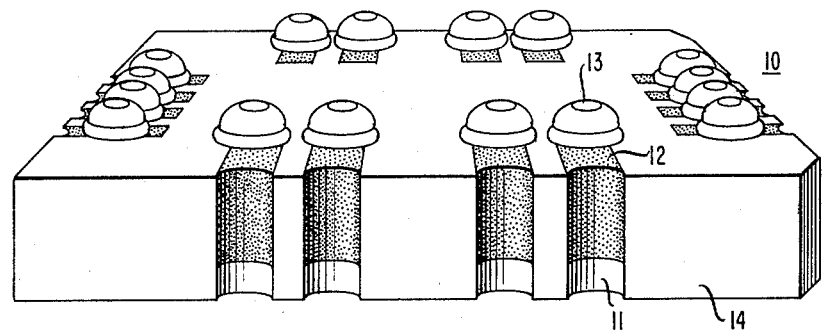
FIG. 1 is a perspective view of the underside of a ceramic chip carrier processed in accordance with one embodiment of the invention.

FIG. 1 illustrates a typical ceramic chip carrier processed in accordance with one embodiment of the invention. The chip carrier, 10, includes a ceramic body, 14, with castellations, 11, formed at certain locations along the edge between the top and bottom major surfaces. Contact members, 12, comprised a multilayer of tungsten-nickel-gold formed on selected portions of the bottom major surface and in the grooves. The members, 12, are coupled to contact pads on the other major surface of the chip carrier (not shown) to which are coupled leads from an integrated circuit chip which has been bonded to the other major surface (for a view of the top surface of a typical chip carrier, see U.S. Patent application of P. M. Hall et al, cited above). In this particular example, the chip carrier had bonded thereto a 16K RAM silicon integrated circuit chip. The carrier was approximately 320×500 mils with a total weight including the chip and hermetic cap of approximately 0.8 grams. The members, 12, had a dimension on the bottom surface of approximately 25×40 mils with a center-to-center separation of 50 mils.

In accordance with a key feature of the invention, solder preforms, 13, were bonded to the contact pads to permit ultimately bonding the carrier to a supporting substrate. The preforms in this example were initially spheres having a diameter of approximately 36 mils. The illustration shows how the spheres have been deformed into an acorn shape by the bonding in accordance with the invention. One of the advantages of the invention can be appreciated by noting the fact that the castellations are free from solder. This permits accurate testing of the circuit chip by probing the castellations.

Figure 2:
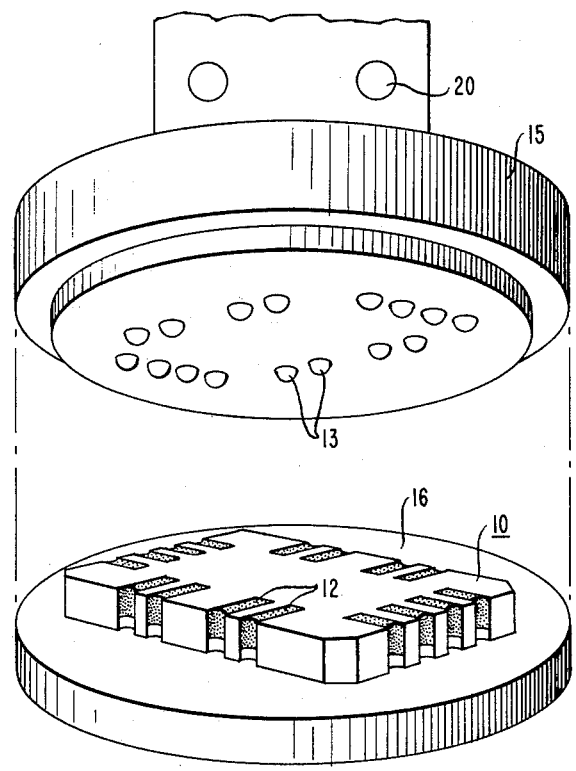
FIG. 2 is a perspective view of a ceramic chip carrier prior to bonding solder preforms thereto and a portion of an apparatus suitable for practicing one embodiment of the invention.

The method of bonding the preforms to the carrier will now be described with reference to FIGS. 2 and 3 which show portions of an apparatus used to carry out this aspect of the invention. The apparatus employed was a commercially available beam lead bonder which is sold by J & A Keller Associates under the designation "Model 3,000 Series." The ram head, 15, was modified to practice the present invention, and basically only this portion of the apparatus is illustrated for the sake of simplicity. The apparatus also included a laterally translatable table containing a solder sphere reservoir (not shown) at one end and a heated stage, 16, on which is placed a chip carrier, 10, at the other end.

Figure 3:
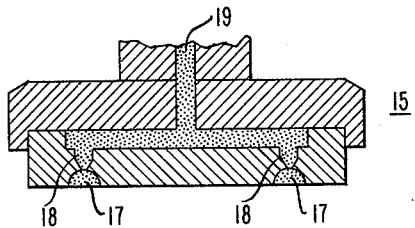
FIG. 3 is a cross-sectional view of a portion of the apparatus in FIG. 2.

The ram head, 15, was designed and constructed to have a configuration of spherical depressions, 17 of FIG. 3, which correspond to the layout of the chip carrier contact members. As further shown in FIG. 3, vacuum ports 18 extend from each depression to a central port 19 which extends through the head to the standard vacuum producing means (not shown). The commercially available apparatus includes tubular heaters, 20 of FIG. 2, in the ram and in the stage 16 of FIG. 2 (though not shown).

With the solder sphere reservoir beneath the head, the head was heated, moved downward into the reservoir, and partially submerged in the collection of solder spheres. The vacuum was applied to the head while vibrating slightly to insure that at least one sphere was picked up at each depression. The vibration was continued for a short time after withdrawal of the head from the reservoir to remove any additional spheres which may cling to a particular depression. The result was that the head included one sphere (13 of FIG. 2) in each depression. The chip carrier, 10, was placed on the heated stage, 16, and the table translated so that the carrier was directly below the head as shown in FIG. 2.

In accordance with one key feature of the invention, the spheres and the chip carrier were heated to a temperature just below the melting temperature of the solder. In this example, the solder comprised 60 percent tin and 40 percent lead which has a melting point of 182 degrees C. The ram head and stage were therefore heated to 175 degrees C., although a range for this solder of 170-178 degrees C. appears useful.

The ram head was then moved downward to bring the solder spheres into contact with the contact members, 12, of the chip carrier. A controlled force was then applied to the spheres, in this case approximately 5 pounds per sphere. The combination of temperature and pressure effected bonds between each sphere and its corresponding contact member. Since the temperature was below the melting point of the solder, the bonding was done by solid state interdiffusion of the solder and the carrier contact metallization, rather than by reflowing the solder according to standard practice. The solder spheres were deformed into the acorn shape by the applied force as shown in FIG. 1.

In supplying force, it is desirable to avoid too much flattening of the spheres, otherwise adjacent preforms may come together and cause an electrical short. At the same time, a sufficient force must be applied to effect the bond. In this example, it appears that 1-6 pounds of force per sphere will be useful. The time of application of the force was approximately 7 seconds. In order to provide fast thruput in production, it is desirable to keep the time as short as possible. A recommended range is, therefore, approximately 3-10 seconds.

It will be noted that the present method provides a means for placing solder preforms exactly where needed in a short period of time and so is suitable for high volume production. Fluxing and cleaning operations which would be necessary if the solder were bonded by reflowing are not needed when the present method is utilized. The estimated hourly output using a single head such as that shown is 300 carriers per hour as opposed to approximately 60-70 per hour if a reflow bonding is employed.

Figure 4:
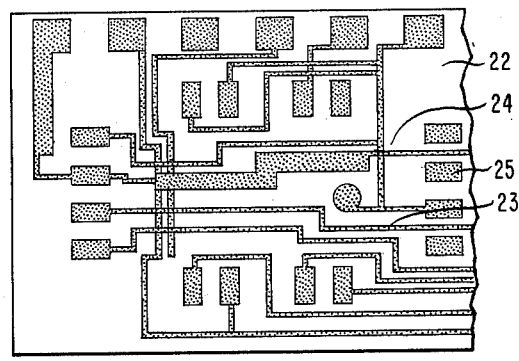
FIG. 4 is a plan view of a portion of a supporting substrate including a thin film circuit to which the component can be bonded in accordance with one embodiment of the invention.

FIG. 4 is a plan view of a portion of a supporting substrate to which the chip carrier was bonded. The substrate, 22, comprised alumina ceramic with a thickness of approximately 25 mils. On a major surface of the substrate, a thin film circuit was formed by standard techniques. Of course, the circuit shown is illustrative only and is in no way intended to limit the invention. The portion of the circuit shown includes interconnecting electrical paths, 23, comprising a multi-layer of titanium-palladium-gold and cross-overs, 24, utilizing glaze as a cross-over dielectric. Other portions of the substrate, not shown, included standard solder pads for appliqued ceramic chip capacitors.

Also included on the substrate were a set of contact members in the form of contact pads, 25, corresponding in number and layout to the set of contact members, 12, on the chip carrier. These contact pads measured 25×40 mils with a center-to-center separation of approximately 50 mils. The pads were made of a multilayer of titanium-palladium-gold formed by standard techniques to a total thickness of approximately 20,000 Angstroms.

Figure 5:
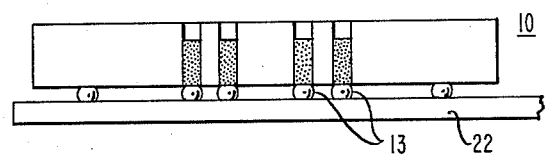
FIG. 5 is a side view of a component bonded to a supporting substrate in accordance with one embodiment of the invention.

In this particular example, the chip carrier was bonded to the substrate by reflowing. That is, a rosin-based flux was applied to the contact members on chip and substrate, the preforms, 13, were brought into contact with associated contact members, 25, on the substrate, and the structure was heated to a temperature of 220-240 degrees C. for approximately 10 seconds to reflow the solder and form the bond. An end view of the resulting structure is shown in FIG. 5. The reflowing of the solder changed the shape to that generally indicated. It will be noted that a gap distance between chip and substrate in excess of 12 mils was typically formed. (For more details on reflow bonding of components to substrates, see U.S. Patent application of Hall, et al, cited above.)

Alternatively, the same solid phase bonding process used to put the preforms on the carrier can be used to bond the carrier to the substrate. Thus, with an appropriate ram head, the chip carrier could be placed so that its preforms contacted the members on the substrate, and the carrier and substrate could then be heated to just below the preform melting point while sufficient force was supplied simultaneously to each preform to result in solid phase bonds.

It will be appreciated that although in this example the solder preforms were first applied to the chip carrier, it may be advantageous in some instances to apply them to the substrate instead. Also, although preforms in the initial shape of spheres were used, the invention appears generally applicable regardless of the geometric shape of the solder. In addition, the invention is not limited to the particular solder composition specified, but should be applicable to any solder. Alloys of tin and lead would appear to be particularly useful, but other compositions might be used. Typical further examples are the compositions of 10 percent tin-90 percent lead and 96 percent tin-4 percent Ag. In the context of this application a "solder" is intended to include any metal or alloy used to unite metallic surfaces and having a melting point of less than 450 degrees C.

Although the invention has been described in terms of bonding chip carriers to supporting substrates including a thin film circuit, it will be understood that the invention is generally applicable whenever an electronic component is bonded to another element and a precise amount of solder is desired at certain locations. For example, the invention may be employed in bonding integrated circuit chips, rather than macro-components, to thin film circuit substrates or to other components such as the metal tape carrier used in the chip-and-tape technology. It is also useful in bonding elements such as ceramic chip capacitors or thin film component chips to substrates. It will also be realized that the substrate could include a thick film circuit or a combination of thick and thin film elements.

It will also be realized that the "contact members" referred to in this application need not be contact pads on the component as shown, but can be any type of element used for electrical contacting including beam leads and the metal fingers produced by the chip-and-tape technology.

Various additional modifications will become apparent to those skilled in the art. All such variations which basically rely on the teachings through which the invention has advanced the art are properly considered within the spirit and scope of the invention.

I claim:

1. In the fabrication of circuit packages, a method for bonding solid solder preforms, 13, to the contact members, 12, of an electronic component CHARACTERIZED IN THAT the preforms are heated to a temperature below the melting point of the solder while sufficient force is applied to the preforms to produce a bond while the solder is kept in a solid phase.

2. A method for fabricating a circuit package including bonding one electronic component (10) with a first set of contact members (12) to another component (22) with a second set of contact members (25) corresponding to the first set of contact members, comprising the steps of bonding solid solder preforms (13) to one of said sets of contact members and bringing the other set of contact members into contact with the solder so as to solder the members together, CHARACTERIZED IN THAT the preforms are bonded to one of said sets of contact members by supplying heat and force to said preforms while keeping the preforms in a solid phase.

3. The method according to claims 1 or 2 wherein the force applied to the preforms lies within the range 1-6 pounds per preform.

4. The method according to claims 1 or 2 wherein the preform is initially in the shape of a sphere.

5. The method according to claims 1 or 2 wherein the solder comprises an alloy of tin and lead.

6. The method according to claims 1 or 2 wherein the solder comprises 60 percent by weight tin and 40 percent by weight lead.

7. The method according to claim 6 wherein during bonding the preform is heated to a temperature of 170-178 degrees C.

8. The method according to claim 2 wherein the electronic component is a ceramic chip carrier and the said other component is a supporting substrate including a film circuit formed thereon.

9. The method according to claim 1 or 2 wherein the contact members are metal pads formed on one surface of the components.

10. The method according to claims 1 or 2 wherein no flux is applied to the contact members prior to bonding the preforms thereto.

11. A method for fabricating a circuit package including bonding one electronic component (10) with a first set of contact members (12) to another component (22) with a second set of contact members (25) corresponding to the first set of contact members, comprising the steps of bonding solid solder preforms (13) to one of said sets of contact members and bringing the other set of contact members into contact with the solder so as to solder the members together, CHARACTERIZED IN THAT the preforms are bonded to one of said sets of contact members by supplying heat and force to said preforms while keeping the preforms in a solid phase, and the contact members are subsequently soldered together by supplying heat and force to said preforms while keeping the preforms in a solid phase.

12. A method for fabricating a circuit package including bonding a chip carrier (10) with a first set of contact pads (12) formed on one surface thereof to a supporting substrate (22) including a second set of contact pads formed on one surface thereof corresponding to the first set of contact pads, comprising the steps of bonding solid solder spheres (13) comprising an alloy of tin and lead to one of said sets of contact pads and bringing the other set of contact pads into contact with the solder so as to solder the pads together, CHARACTERIZED IN THAT the spheres are bonded to one of said sets of contact pads by heating the spheres and contact pads at a temperature below the melting point of the solder and supplying a force of 1-6 pounds per sphere so that the solder remains in a solid phase during bonding.

13. The method according to claim 12 wherein no flux is applied to the one of said sets of contact pads prior to bonding the spheres thereto.

* * * * *